(12) United States Patent
Lee (10) Patent No.: US 9,818,493 B2
(45) Date of Patent: Nov. 14, 2017

(54) MEMORY DEVICE, MEMORY SYSTEM, AND METHOD FOR OPERATING MEMORY DEVICE

(71) Applicant: SK hynix Inc., Gyeonggi-do (KR)

(72) Inventor: Dong-Uk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 51 days.

(21) Appl. No.: 14/469,159

(22) Filed: Aug. 26, 2014

(65) Prior Publication Data

US 2015/0310931 A1 Oct. 29, 2015

(30) Foreign Application Priority Data

Apr. 28, 2014 (KR) .................. 10-2014-0050784

(51) Int. Cl.

| | | |
|---|---|---|
| G11C 29/36 | (2006.01) | |
| G11C 29/38 | (2006.01) | |
| G11C 29/10 | (2006.01) | |
| G11C 29/26 | (2006.01) | |

(52) U.S. Cl.
CPC .............. *G11C 29/36* (2013.01); *G11C 29/10* (2013.01); *G11C 29/26* (2013.01); *G11C 2029/2602* (2013.01)

(58) Field of Classification Search
CPC ......... G11C 29/38; G11C 29/36; G11C 29/10; G11C 29/26; G11C 2029/2602; G11C 7/22; G11C 11/4076; G11C 29/02; G11C 29/025; G11C 29/028; G11C 29/50012; G11C 5/04; G11C 7/1045; G11C 7/222; H05K 1/0248; H05K 1/0268; H05K 1/14; H05K 2201/044; H05K 2201/09781
See application file for complete search history.

(56) References Cited

U.S. PATENT DOCUMENTS

| | | | | |
|---|---|---|---|---|
| 5,732,284 | A | * | 3/1998 | Kono .................. G06F 13/4243 710/25 |
| 2005/0007835 | A1 | * | 1/2005 | Lee .......................... G11C 5/00 365/189.12 |
| 2007/0255983 | A1 | * | 11/2007 | Funaba .................... G11C 5/04 714/724 |

(Continued)

FOREIGN PATENT DOCUMENTS

| | | |
|---|---|---|
| KR | 1020110058028 | 6/2011 |
| KR | 1020120067724 | 6/2012 |

*Primary Examiner* — Kyle Vallecillo
(74) *Attorney, Agent, or Firm* — IP & T Group LLP (57) ABSTRACT

A memory device includes a first memory block suitable for transmitting and receiving signals through a first channel, a second memory block suitable for transmitting and receiving signals through a second channel, and a test control unit suitable for applying a first command signal among a plurality of command signals to the first and second channels at different values, while applying the plurality of command signals from an exterior of the memory device to the first and second channels in a test operation, wherein the first command signal distinguishes write and read operations of the first and second memory blocks, wherein, when the first memory block performs a read operation in the test operation, the second memory block performs a write operation, and data outputted from the first memory block is inputted to the second memory block.

6 Claims, 7 Drawing Sheets

(56) References Cited

U.S. PATENT DOCUMENTS

2011/0179210 A1\* 7/2011 Matano ................. G11C 5/063
710/305
2012/0294058 A1\* 11/2012 Best ........................ G11C 5/02
365/51

\* cited by examiner

MEMORY DEVICE, MEMORY SYSTEM, AND METHOD FOR OPERATING MEMORY DEVICE

CROSS-REFERENCE TO RELATED APPLICATIONS

The present application claims priority of Korean Patent Application No. 10-2014-0050784, filed on Apr. 28, 2014, which is incorporated herein by reference in its entirety.

BACKGROUND

1. Field

This patent document relates to a memory device, a memory system, and a method for operating a memory device.

2. Description of the Related Art

The semiconductor memory device market continues demand higher integration, higher capacity and higher operation speeds. This new generation of semiconductor memory devices is highly integrated and has multiple memory blocks that may independently transmit and receive command signals, addresses and data. Additionally, this new generation of semiconductor memory devices has multiple facets integrated in a single semiconductor memory device.

Figure 1:
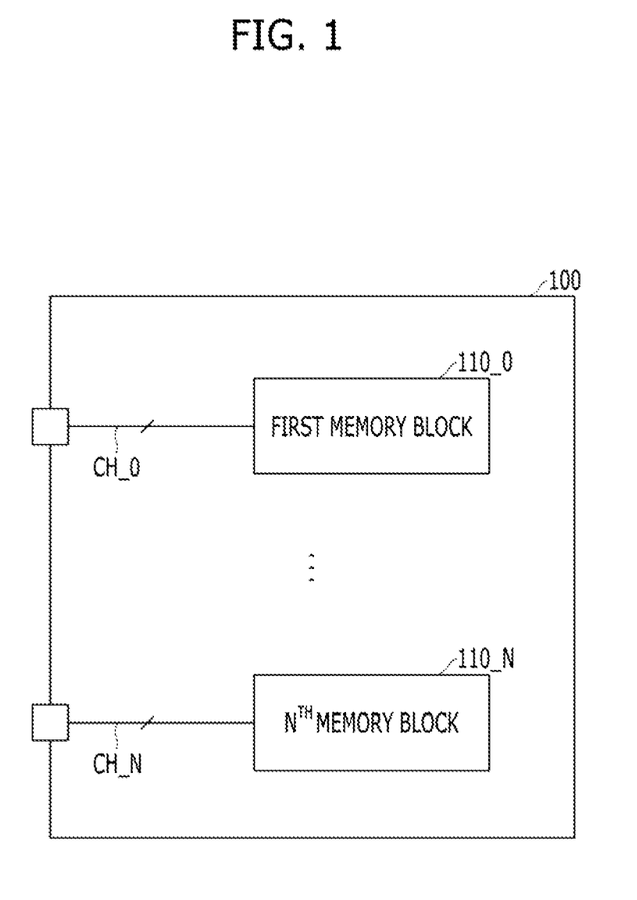
FIG. 1 is a configuration diagram of a semiconductor memory device including a plurality of memory blocks.

FIG. 1 is a configuration diagram of a semiconductor memory device 100 including a plurality of memory blocks 110_0 to 110_N.

The semiconductor memory device 100 includes a plurality of channels CH_0 to CH_N which respectively correspond to the plurality of memory blocks 110_0 to 110_N. The plurality of memory blocks 110_0 to 110_N may receive command signals and addresses and may receive and transmit data, from and to an exterior of the semiconductor memory device 100 through corresponding channels among the plurality of channels CH_0 to CH_N. For reference, each of the plurality of channels CH_0 to CH_N includes a plurality of lines for transferring signals.

After the semiconductor memory device 100 is fabricated, it is necessary to perform a test to check whether the semiconductor memory device 100 operates properly. In order to perform the test, it is necessary to apply signals to the plurality of memory blocks 110_0 to 110_N included in the semiconductor memory device 100 and thereby operate the memory blocks 110_0 to 110_N. In order to separately apply testing signals to the respective memory blocks 110_0 to 110_N from the exterior (for example, test equipment), signal input/output ports are needed in numbers equal to the plurality of channels CH_0 to CH_N included in the semiconductor memory device 100.

Since test equipment has a limited number of signal input/output ports, the number of semiconductor memory devices which may be tested at a time by the test equipment decreases when the number of ports needed to test one memory device increases. As a consequence, time and cost required to perform a test may increase.

SUMMARY

Various embodiments are directed to a memory device, a memory system and a method for operating a memory device, which may include a plurality of memory blocks inputting and outputting signals through respective channels and may be tested through a reduced number of ports.

Also, various embodiments are directed to a memory device, a memory system and a method for operating a memory device, which may simultaneously test signal input/output operations of a plurality of memory blocks by controlling the plurality of memory blocks to perform different operations, while minimizing the number of ports needed for a test.

In an embodiment, a memory device may include a first memory block suitable for transmitting and receiving signals through a first channel, a second memory block suitable for transmitting and receiving signals through a second channel, and a test control unit suitable for applying a first command signal among a plurality of command signals to the first and second channels at different values, while applying the plurality of command signals from an exterior of the memory device to the first and second channels in a test operation, wherein the first command signal distinguishes write and read operations of the first and second memory blocks, wherein, when the first memory block performs a read operation in the test operation, the second memory block performs a write operation, and data outputted from the first memory block is inputted to the second memory block.

In an embodiment, a memory system may include a first memory device including a plurality of first memory blocks which transmit and receive signals through a plurality of first channels, respectively, and a first test control unit which applies a plurality of command signals from an exterior of the first memory device to the plurality of first channels, in a test operation, and a second memory device including a plurality of second memory blocks which transmit and receive signals through a plurality of second channels, respectively, and correspond to the plurality of first memory blocks, respectively, and a second test control unit which applies the plurality of command signals from an exterior of the second memory device to the plurality of second channels, in the test operation, wherein the first test control unit and the second test control unit apply a first command signal among the plurality of command signals, which distinguishes write and read operations, to the first channels and the second channels at different values, and wherein, when the first memory blocks perform a read operation in the test operation, the second memory blocks perform a write operation, and data outputted from the first memory blocks are inputted to the second memory blocks corresponding thereto, respectively.

In an embodiment, a method for operating a memory device may include a first memory block and a second memory block, the method including applying a plurality of command signals to the first memory block and the second memory block with a first command signal among the plurality of command signals, which distinguishes write and read operations, at different values, wherein the first memory block performs a read operation and the second memory block performs a write operation, inputting data outputted from the first memory block, to the second memory block, applying the plurality of command signals to the first memory block and the second memory block with the first command signal at different values, wherein the second memory block performs the read operation and the first memory block performs the write operation, and inputting data outputted from the second memory block, to the first memory block.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
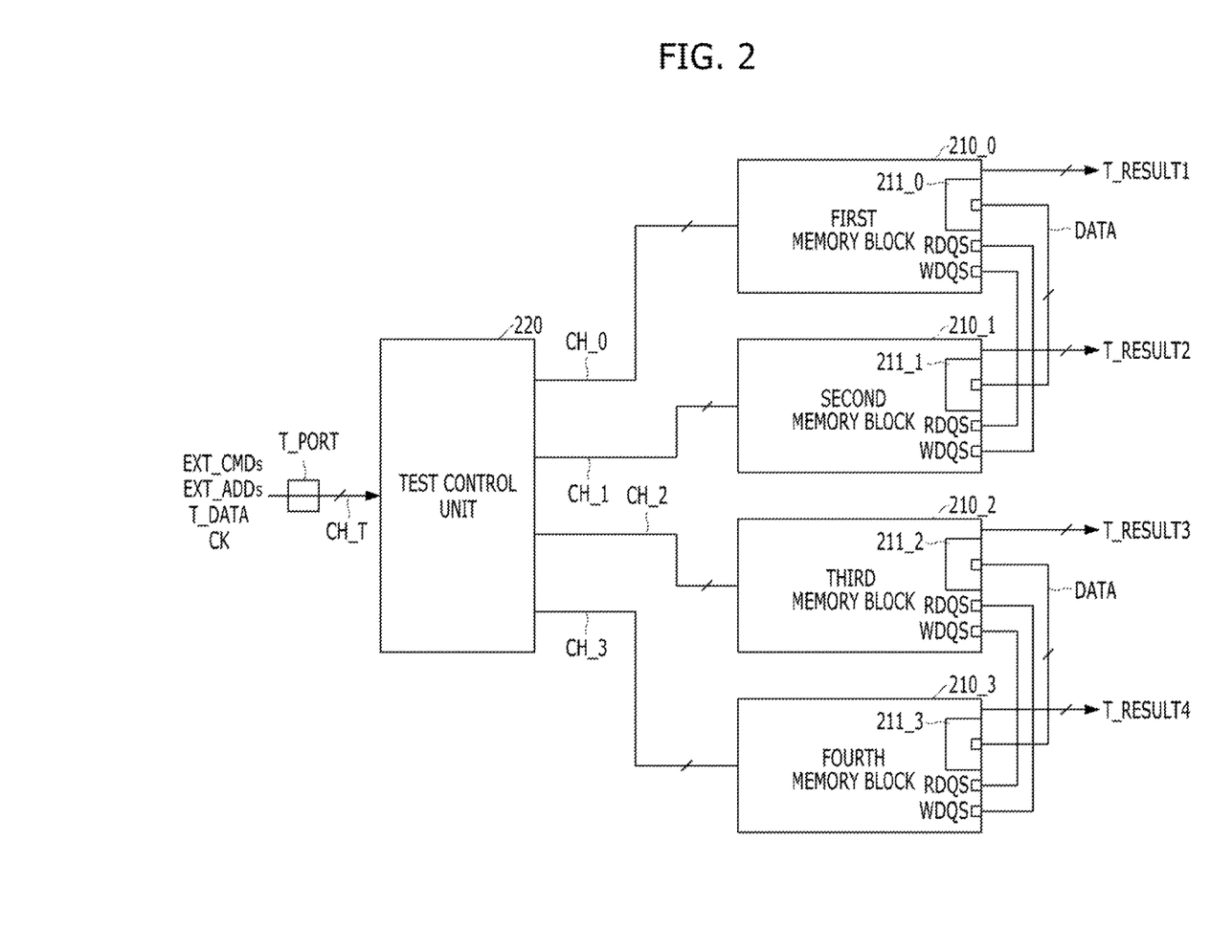
FIG. 2 is a configuration diagram of a memory device in accordance with an embodiment.

FIG. 2 is a configuration diagram of a memory device in accordance with an embodiment.

As shown in FIG. 2, the memory device may include first to fourth memory blocks 210_0 to 210_3, a test control unit 220, a test channel CH_T, and first to fourth channels CH_0 to CH_3.

The memory device will be described below with reference to FIG. 2.

The first to fourth memory blocks 210_0 to 210_3 respectively correspond to first to fourth channels CH_0 to CH_3. The test control unit 220 transfers a plurality of command signals CMDs (see FIG. 3), addresses ADDs (see FIG. 3) and test data T_DATA to first to fourth memory blocks 210_0 to 210_3 through the first to fourth respective channels CH_0 to CH_3. The first to fourth memory blocks 210_0 to 210_3 perform an operation corresponding to a combination of the command signals CMDs inputted thereto through the corresponding channels. For example, in the case where a combination of the command signals CMDs is a read command corresponding to a read operation, the first to fourth memory blocks 210_0 to 210_3 output the data stored therein, and in the case where a combination of the command signals CMDs is a write command corresponding to a write operation, the first to fourth memory blocks 210_0 to 210_3 store inputted data.

A memory block, which performs the read operation, outputs, together with output data, a read strobe signal RDQS which is synchronized with the output data. A memory block, which performs the write operation, receives, together with input data, a write strobe signal WDQS which is synchronized with the input data.

For reference, the plurality of command signals CMDs may include a row address strobe signal (RASB), a column address strobe signal (CASB), a chip select signal (CSB), and a write enable signal (WEB). In addition to these signals, the plurality of command signals CMDs may include other command signals for allowing the memory device to perform a specified operation.

The first to fourth memory blocks 210_0 to 210_3 include first to fourth data transmission and reception units 211_0 to 211_3, respectively. The first to fourth data transmission and reception units 211_0 to 211_3 output data read from the first to fourth respective memory blocks 210_0 to 210_3 or receive data to be written in the first to fourth respective memory blocks 210_0 to 210_3.

In a test, the test control unit 220 receives a plurality of command signals EXT_CMDs, addresses EXT_ADDs, the test data T_DATA and a clock CK, which are inputted from an exterior of the to memory device, through the test channel CH_T, and applies them to the first to fourth channels CH_0 to CH_4. The signals EXT_CMDs, EXT_ADDs, T_DATA and CK applied through the test channel CH_T may be inputted from the exterior to the memory device through a test port T_PORT included in the memory device.

While the test control unit 220 receives the plurality of command signals EXT_CMDs and applies the plurality of command signals CMDs to the first to fourth channels CH_0 to CH_4, the test control unit 220 may apply a first command signal WEB among the plurality of command signals CMDs, which distinguishes write and read operations, to the first to fourth channels CH_0 to CH_4 at different values. For example, the test control unit 220 may apply the first command signal WEB to the first and third channels CH_0 and CH_2 such that the first command signal WEB has an activated value (for example, a logic low value), and may apply the first command signal WEB to the second and fourth channels CH_1 and CH_3 such that the first command signal WEB has a deactivated value (for example, a logic high value). For reference, the first command signal WEB may be the write enable signal (WEB) among the plurality of command signals (RASB, CASB, CSB and WEB) described above.

A combination of the plurality of command signals CMDs may represent a write command in the case where the first command signal WEB among the plurality of command signals CMDs is activated, and a combination of the plurality of command signals CMDs may represent a read command in the case where the first command signal WEB among the plurality of command signals CMDs is deactivated.

Hereinbelow, the test operation of the memory device will be described based on the foregoing. The test operation of the memory device may be a test for checking whether or not the first to fourth data transmission and reception units 211_0 to 211_3 included in the first to fourth memory blocks 210_0 to 210_3 operate properly.

In the test, the data transmission and reception units 211_0 and 211_1 of the first memory block 210_0 and the second memory block 210_1 may be connected with each other, and the data transmission and reception units 211_2 and 211_3 of the third memory block 210_2 and the fourth memory block 210_3 may be connected with each other. Accordingly, the data outputted from the first memory block 210_0 and the third memory block 210_2 are respectively inputted to the second memory block 210_1 and the fourth memory block 210_3, and the data outputted from the second memory block 210_1 and the fourth memory block 210_3 are respectively inputted to the first memory block 210_0 and the third memory block 210_2.

For the test, the plurality of command signals EXT_CMDs and the addresses EXT_ADDs for setting the first to fourth memory blocks 210_0 to 210_3 to a test mode are applied to the first to fourth channels CH_0 to CH_4 through the test channel CH_T and the test control unit 220. The first to fourth memory blocks 210_0 to 210_3 are set to the test mode in response to the signals CMDs and ADDs applied through the corresponding channels. The test data T_DATA to be used in the test may be applied to the first to fourth channels CH_0 to CH_4 through the test channel CH_T and the test control unit 220, and may be stored in the first to fourth memory blocks 210_0 to 210_3. The test data T_DATA may have a specified pattern to perform the test easily.

After the memory device is set to the test mode, the plurality of command signals EXT_CMDs corresponding to the write command or the read command may be inputted from the exterior. The test control unit 220 may receive the plurality of command signals EXT_CMDs and apply the plurality of command signals CMDs to the first to fourth channels CH_0 to CH_4 in such a way that the first command signal WEB among the command signals CMDs has different values at the first to fourth channels CH_0 to CH_4.

For example, in the case where the plurality of command signals EXT_CMDs inputted from the exterior represent the read command, the test control unit 220 may transfer the command signals CMDs which are the same as the command signals EXT_CMDs inputted from the exterior, to the first and third channels CH_0 and CH_2, but may transfer the command signals CMDs to the second and fourth channels CH_1 and CH_3 by differentiating only the value of the first command signal WEB.

In this case, since the command signals CMDs transferred to the first and third channels CH_0 and CH_2 correspond to the read command, the first and third memory blocks 210_0 and 210_2 perform the read operation and output data DATA and the read strobe signal RDQS. The data DATA outputted by the first and third memory blocks 210_0 and 210_2 may be the test data T_DATA which is stored in the first to fourth memory blocks 210_0 to 210_3 for the test.

Also, since the command signals CMDs transferred to the second and fourth channels CH_1 and CH_3 correspond to the write command, the second and fourth memory blocks 210_1 and 210_3 receive the data DATA and the read strobe signal RDQS which are outputted from the first and third memory blocks 210_0 and 210_2, respectively. The read strobe signal RDQS outputted from the first and third memory blocks 210_0 and 210_2 become the write strobe signal WDQS of the second and fourth memory blocks 210_1 and 210_3. The second and fourth memory blocks 210_1 and 210_3 compare the inputted data DATA and the test data T_DATA stored in them, and store comparison results.

In the case where the plurality of command signals EXT_CMDs Inputted from the exterior represent the write command, conversely to the read command described above, the first and third memory blocks 210_0 and 210_2 perform the write operation, and the second and fourth memory blocks 210_1 and 210_3 perform the read operation. Through this, the test data T_DATA of the second and fourth memory blocks 210_1 and 210_3 are inputted to the first and third memory blocks 210_0 and 210_2, and the first and third memory blocks 210_0 and 210_2 store results of comparing the test data T_DATA stored in them and the inputted test data T_DATA.

If the procedure described above is completed, results T_RESULT1 to T_RESULT4 of comparing the test data T_DATA stored in the first to fourth memory blocks 210_0 to 210_3 of the memory device may be outputted to the exterior of the memory device. For reference, in the test, the memory blocks 210_0 to 210_3 may operate in synchronization with the clock CK.

By referring to the comparison results T_RESULT1 to T_RESULT4, in the case where the test data T_DATA stored in the memory blocks 210_0 to 210_3 are the same as the test data T_DATA inputted when the respective memory blocks 210_0 to 210_3 perform the write operation, it means that the data transmitting operations and data receiving operations of the memory blocks 210_0 to 210_3 have no problem. That is to say, it may be determined that the respective data transmission and reception units 211_0 to 211_3 of the memory blocks 210_0 to 210_3 operate properly.

As a consequence, even in the case where a memory device includes a plurality of memory blocks, all the memory blocks may be tested at the same time by using a minimum number of channels. Therefore, test time and cost may be decreased.

Figure 3:
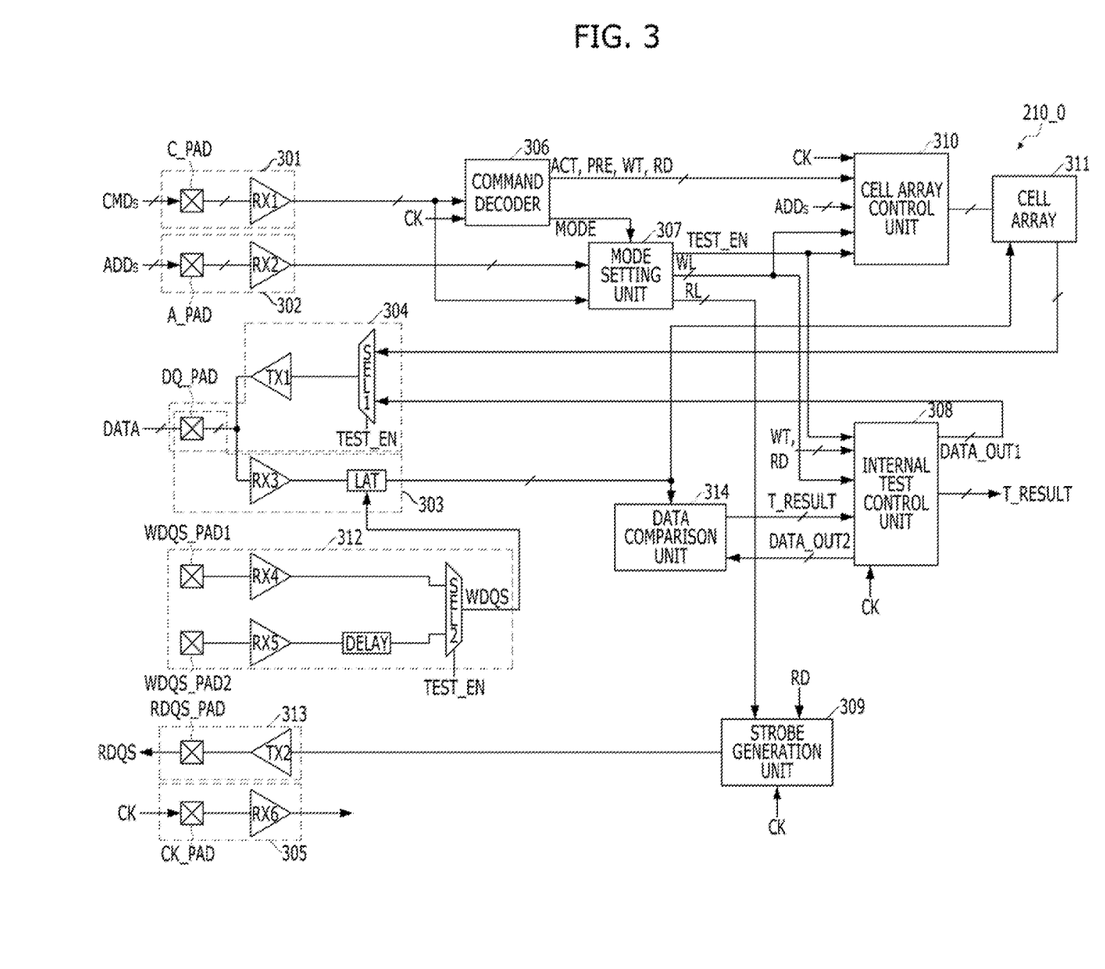
FIG. 3 is a configuration diagram of a first memory block shown in FIG. 2.

FIG. 3 is a configuration diagram of the first memory block 210_0.

As shown in FIG. 3, the first memory block 210_0 may include a command reception unit 301, an address reception unit 302, a data reception unit 303, a data transmission unit 304, a clock reception unit 305, a command decoder 306, a mode setting unit 307, an internal test control unit 308, a strobe generation unit 309, a cell array control unit 310, and a cell array 311. The first memory block 210_0 may further include a strobe reception unit 312, a strobe transmission unit 313, and a data comparison unit 314. For reference, the above-described first data transmission and reception unit 211_0 may include the data reception unit 303 and the data transmission unit 304. One or more of the components 301 to 314 of the first memory block 210_0 may operate in synchronization with the clock CK.

The first memory block 210_0 will be described below with reference to FIG. 3.

The command reception unit 301 may receive the plurality of command signals CMDs, and the address reception unit 302 may receive the addresses ADDs, and the data reception unit 303 may receive the data DATA, and the data transmission unit 304 may output internal data, and the clock reception unit 305 may receive the clock CK. The plurality of command signals CMDs, the addresses and the data DATA may include multi-bit signals. Also, the strobe reception unit 312 may receive the write strobe signal WDQS which is inputted together with data to write, in the write operation, and the strobe transmission unit 313 may output the read strobe signal RDQS which is generated by the strobe generation unit 309, together with read data, in the read operation.

The command reception unit 301 may include a pad C_PAD and a receiver RX1. The address reception unit 302 may include a pad A_PAD and a receiver RX2.

The data reception unit 303 receives the data DATA through a pad DQ_PAD, and the data transmission unit 304 outputs the data DATA through the pad DQ_PAD. The data reception unit 303 may include a receiver RX3 and a latch section LAT which latches inputted data in response to the write strobe signal WDQS. The data transmission unit 304 may include a transmitter TX1 and a selecting section SEL1. The selecting section SEL1 may transfer the data outputted from the cell array 311, to the transmitter TX1, when a test enable signal TEST_EN is deactivated, and may transfer the data outputted from the internal test control unit 308, to the transmitter TX1, when the test enable signal TEST_EN is activated.

The strobe reception unit 312 may include pads WDQS_PAD1 and WDQS_PAD2, receivers RX4 and RX5, and a delay section DELAY. The strobe reception unit 312 may further include a selecting section SEL2 which transfers the output of the receiver RX4 as the write strobe signal WDQS when the test enable signal TEST_EN is deactivated and transfers the output of the receiver RX5 as the write strobe signal WDQS when the test enable signal TEST_EN is activated. The delay section DELAY may delay the signal outputted from the receiver RX5, by a predetermined delay value.

The strobe transmission unit 313 may include a pad RDQS_PAD and a transmitter TX2. The strobe transmission unit 313 may transmit the read strobe signal RDQS in the read operation. The clock reception unit 305 may include a pad CK_PAD and a receiver RX6, and may receive the clock CK which is inputted from the exterior.

The command decoder 306 may decode the plurality of command signals CMDs which are inputted through the command reception unit 301, and may generate an activation command ACT, a precharge command PRE, a write command WT, a read command RD, and a mode setting command MODE. The command decoder 306 may activate a command corresponding to a combination of inputted command signals CMDs, among these commands ACT, PRE, WT, RD and MODE.

The mode setting unit 307 may set an operation mode of the memory device in response to the plurality of command signals CMDs and the addresses ADDs when the mode setting command MODE is activated. The mode setting unit 307 may activate the test enable signal TEST_EN when the memory device is set to the test mode, and may deactivate the test enable signal TEST_EN when the memory device is not in the test mode.

The mode setting unit 307 may set a latency. The latency may represent a standby time for staring an operation in response to a command, i.e., a time from the input of the command to the start of the operation. For example, it takes a standby time until read data start to be outputted from the first memory block 210_0 through the data transmission unit 304 after a read command is applied to the first memory block 210_0, which is referred to as a read latency. It takes a standby time until write data start to be inputted to the first memory block 210_0 through the data reception unit 303 after a write command is applied to the first memory block 210_0, which is referred to as a write latency. The mode setting unit 307 may output information RL and WL on a read latency and a write latency that are set.

The internal test control unit 308 may store the test data T_DATA transmitted from the test control unit 220, and may output data DATA_OUT1 stored therein when the read command RD is inputted with the test enable signal TEST_EN activated. Also, the internal test control unit 308 may output data DATA_OUT2 stored therein when the write command WT is inputted with the test enable signal TEST_EN activated, and may store a result T_RESULT of comparing the outputted data DATA_OUT2 and the inputted data DATA. When the test is completed, the internal test control unit 308 may output the stored comparison result T_RESULT to the exterior of the memory device. The comparison result T_RESULT may be outputted to the exterior of the memory device through the data transmission unit 304 or a separately provided signal transmission unit (not shown).

In the write operation under the test mode, the data comparison unit 314 compares the data DATA inputted through the data reception unit 303 and the data DATA_OUT2 outputted from the internal test control unit 308, generates the comparison result T_RESULT, and outputs the comparison result T_RESULT to the internal test control unit 308.

The strobe generation unit 309 activates the read strobe signal RDQS after a time corresponding to the read latency RL has passed from the activation of the read command RD.

The read strobe signal RDQS is outputted to the exterior of the memory device through the strobe transmission unit 313.

The cell array 311 includes a plurality of word lines, a plurality of bit lines, and a plurality of memory cells connected between them. Since the structure of the cell array 311 is well known in the art, the detailed illustration thereof will be omitted.

The cell array control unit 310 writes data in the cell array 311 or reads the data stored in the cell array 311, in response to the commands ACT, PRE, RD and WT. The cell array control unit 310 activates a word line corresponding to the addresses ADDs (row addresses), in response to the activation command ACT. Moreover, the cell array control unit 310 outputs the data of a bit line corresponding to the addresses ADDs (column addresses), in response to the read command RD, and transfers data to be written in a bit line corresponding to the addresses ADDs (column addresses), in response to the write command WT. Furthermore, the cell array control unit 310 precharges an activated word line in response to the precharge command PRE.

The test operation of the first memory block 210_0 will be described based on the foregoing.

Before or after the memory block is set to the test mode, the test data T_DATA are stored in the internal test control unit 308. The test data T_DATA may be transferred to the internal test control unit 308 through the data reception unit 303 or a separate signal reception unit (not shown) provided in the memory block.

The mode setting command MODE is activated to set the memory block to the test mode. The memory block is set to the test mode by a combination of the command signals CMDs and the addresses ADDs. If the memory block is set to the test mode, the mode setting unit 307 activates the test enable signal TEST_EN.

With the mode setting command MODE activated, a read latency and a write latency may also be set by the combination of the command signals CMDs and the addresses ADDs of the memory block. In order for testing of the memory block, the read latency and the write latency may be set to have the same value. If the read latency and the write latency are set, the mode setting unit 307 may output the read latency RL and the write latency WL.

If the read command RD is activated after mode setting is completed, the test data T_DATA is outputted as the data DATA_OUT1, from the internal test control unit 308. The first selecting section SEL1 outputs the test data T_DATA to the transmitter TX1 in response to the test enable signal TEST_EN. After the read latency which was set has passed from a time when the read command RD was activated, the test data T_DATA starts to be outputted through the pad DQ_PAD. The strobe generation unit 309 activates the read strobe signal RDQS after the read latency has passed from a time when the read command RD was activated, and the read strobe signal RDQS is outputted through the strobe transmission unit 313.

The write command WT is activated when a predetermined time has passed after the read operation was completed, and the test data T_DATA is inputted through the data reception unit 303 at a time when the write latency has passed from a time when the write command WT was activated. The write strobe signal WDQS is inputted together through the pad WDQS_PAD2. The second selecting section SEL2 selects and outputs the write strobe signal WDQS outputted from the receiver RX5 and delayed by the delay section DELAY, in response to the test enable signal TEST_EN. As described above with reference to FIG. 2, in the case where the first memory block 210_0 stores the data outputted from the second memory block 210_1, the strobe signal inputted through the pad WDQS_PAD2 may be outputted through the pad RDQS_PAD of the second memory block 210_1. The latch section LAT latches the test data T_DATA in response to the write strobe signal WDQS.

The data comparison unit 314 compares the inputted test data T_DATA and the data DATA_OUT2 outputted from the internal test control unit 308 and outputs the comparison result T_RESULT. The internal test control unit 308 stores the comparison result T_RESULT. After the test is completed, the comparison result T_RESULT stored in the internal test control unit 308 may be outputted to the exterior of the memory device. For reference, in the case where the same test data T_DATA is stored in the first memory block 210_0 and the second memory block 210_1, it is possible to check whether the data reception unit 303 and the data transmission unit 304 of the first memory block 210_0 operate properly, by referring to the comparison result T_RESULT.

For reference, in the case where the test enable signal TEST_EN is deactivated, the memory block performs a normal operation (an activation operation, a precharge operation, a read operation or a write operation). When the memory block performs a normal operation, the first selecting section SEL1 selects the data outputted from the cell array 311, and the second selecting section SEL2 selects the signal inputted through the pad WDQS_PAD1. In the activation operation, the cell array control unit 310 activates a word line corresponding to the addresses ADDs. In the read operation, data is outputted from the cell array 311 by the cell array control unit 310, and the outputted data is outputted to the exterior of the memory block through the data transmission unit 304. In the write operation, the data inputted to the data reception unit 303 is latched by the latch section LAT in response to the write strobe signal WDQS which is inputted through the pad WDQS_PAD1, and are written in the cell array 311 by the cell array control unit 310. In the precharge operation, an activated word line is precharged by the cell array control unit 310.

The second to fourth memory blocks 210_1 to 210_3 of FIG. 2 have the same configuration as the first memory block 210_0. In the test, when the first memory block 210_0 performs the read operation, the third memory block 210_2 may perform the read operation together with the first memory block 210_0, and the second and fourth memory blocks 210_1 and 210_3 may perform the write operation. Conversely, when the first memory block 210_0 performs the write operation, the third memory block 210_2 may perform the write operation together, and the second and fourth memory blocks 210_1 and 210_3 may perform the read operation. The mode setting operation, the read operation and the write operation of each memory block are the same as described above.

Figure 4A:
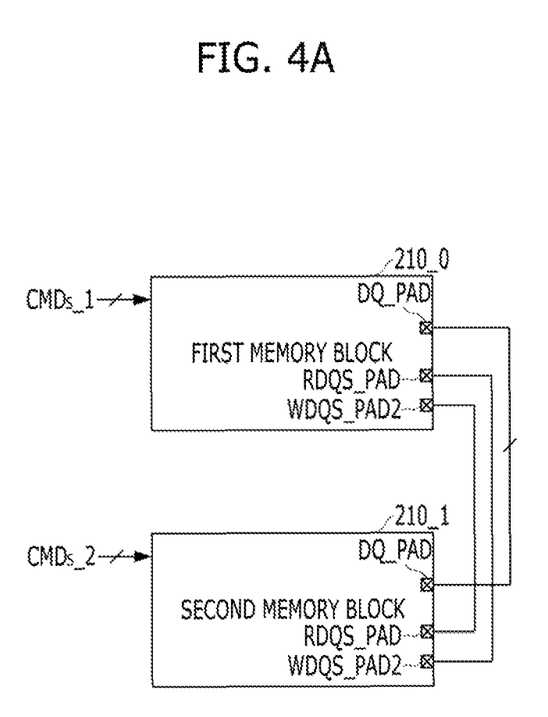
FIGS. 4A and 4B are diagrams explaining operations of the memory device in accordance with the embodiment.
Figure 4B:
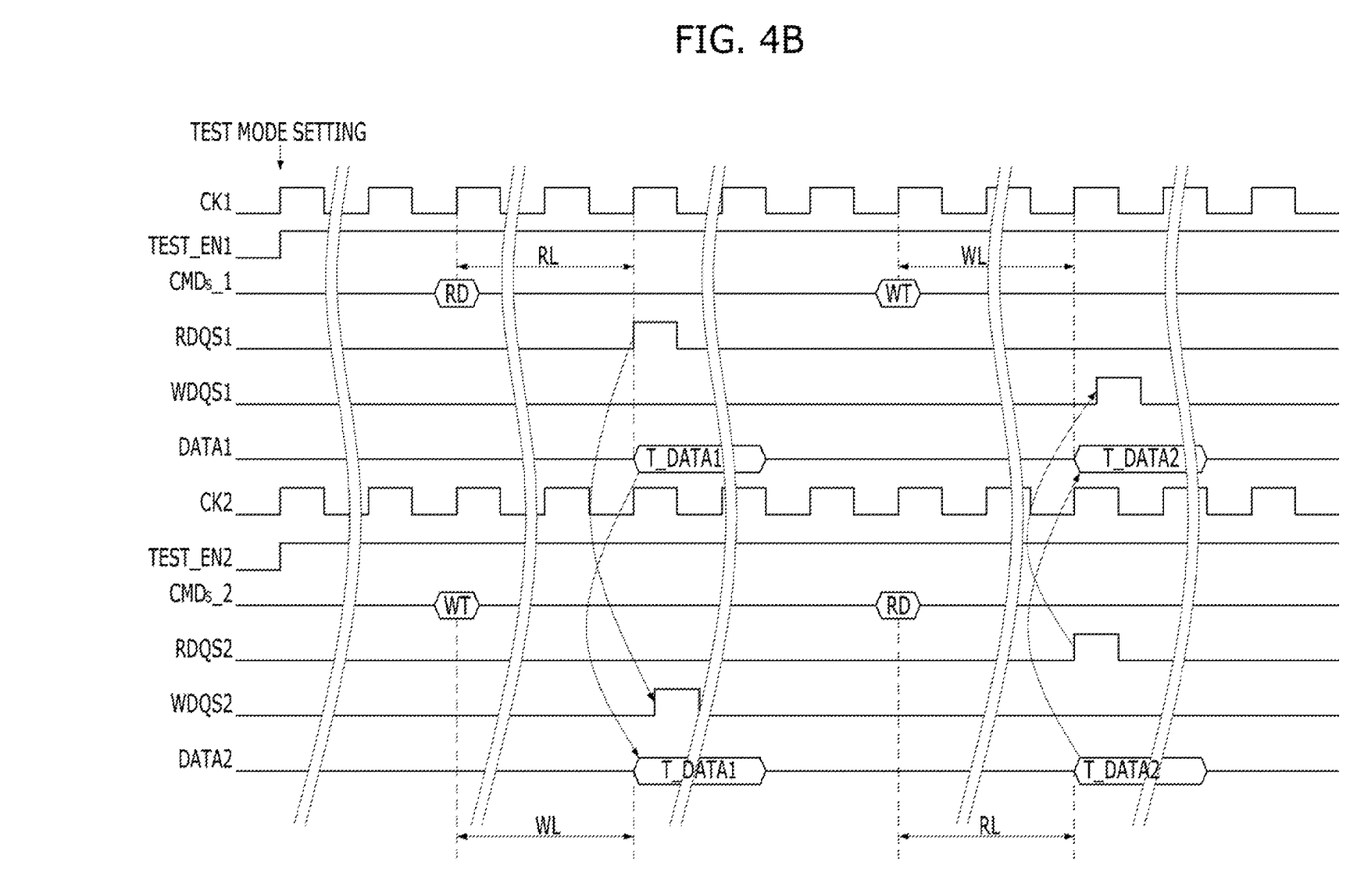

FIGS. 4A and 4B are diagrams explaining operations of the memory device in accordance with an embodiment.

FIG. 4A is a diagram which shows how signals are applied to the first memory block 210_0 and the second memory block 210_1 and how the first memory block 210_0 and the second memory block 210_1 are connected. FIG. 4B is a waveform diagram explaining the operation of the memory device.

As shown in FIG. 4A, a plurality of command signals CMDs_1 and CMDs_2 are respectively applied to the first and second memory blocks 210_0 and 210_1, and the data pads DQ_PAD of the first and second memory blocks 210_0 and 210_1 are connected with each other. The pad RDQS_PAD of the first memory block 210_0 and the pad WDQS_PAD2 of the second memory block 210_1 are connected, and the pad RDQS_PAD of the second memory block 210_1 and the pad WDQS_PAD2 of the first memory block 210_0 are connected.

In FIG. 4B, the operation of the memory block will be described by referring to the waveforms of the commands and the data inputted to and outputted from the first memory block 210_0 and the second memory block 210_1.

CK1 designates a clock signal with which the first memory block 210_0 operates in synchronization, and CK2 designates a clock signal with which the second memory block 210_1 operates in synchronization. TEST_EN1 designates the test enable signal TEST_EN of the first memory block 210_0, and TEST_EN2 designates the test enable signal TEST_EN of the second memory block 210_1.

CMDs_1 designates command signals which are applied to the first memory block 210_0, and CMDs_2 designates command signals which are applied to the second memory block 210_1. RDQS1 designates a signal which is outputted through the pad RDQS_PAD of the first memory block 210_0, and RDQS2 designates a signal which is outputted through the pad RDQS_PAD of the second memory block 210_1. WDQS1 designates the write strobe signal WDQS (the output of the second selecting section SEL2) of the first memory block 210_0, and WDQS2 designates the write strobe signal WDQS of the second memory block 210_1.

DATA1 designates the data which is outputted through the pad DQ_PAD of the first memory block 210_0, and DATA2 designates the data which is outputted through the pad DQ_PAD of the second memory block 210_1. T_DATA1 designates the test data T_DATA which is stored in the first memory block 210_0, and T_DATA2 designates the test data T_DATA which is stored in the second memory block 210_1.

If both the first and second memory blocks 210_0 and 210_1 are set to the test mode, the test enable signals TEST_EN1 and TEST_EN2 are activated. In the test mode, the read command RD is applied to the first memory block 210_0, and at the same time, the write command WT is applied to the second memory block 210_1. The first memory block 210_0 outputs the first read strobe signal RDQS1 and the test data T_DATA1 at a time when the read latency RL has passed after the read command RD was applied.

The second memory block 210_1 receives the test data T_DATA1, based on the second write strobe signal WDQS2, at a time when the write latency WL has passed after the write command WT was applied, compares the inputted test data T_DATA1 and the stored test data T_DATA2, and stores a comparison result. Since the read latency RL of the first memory block 210_0 and the write latency WL of the second memory block 210_1 are set to be the same, the second memory block 210_1 may receive and use the first read strobe signal RDQS1 as the second write strobe signal WDQS2.

Although a read strobe signal has the same phase with the data outputted from a memory block, a write strobe signal may have a phase difference of 0.25*tCK (when 1*tCK corresponds to one cycle of a clock CK) from the data inputted to the memory block. In this regard, since the first read strobe signal RDQS1 has the same phase as the data DATA1, the second write strobe signal WDQS2 may be generated by delaying the first read strobe signal RDQS1 by 0.25*tCK using the delay section DELAY in the second memory block 210_1. This may be applied the same to the case of transmitting the data of the second memory block 210_1 to the first memory block 210_0. The delay value of the delay section DELAY may be changed depending on its circuit design.

If the operations described above are completed, next, the write command WT is applied to the first memory block 210_0, and at the same time, the read command RD is applied to the second memory block 210_1. Through a similar procedure as described above, the test data T_DATA2 of the second memory block 210_1 is transmitted to the first memory block 210_0, and the first memory block 210_0 stores a result of comparing the inputted test data T_DATA2 and the stored test data T_DATA1.

Figure 5:
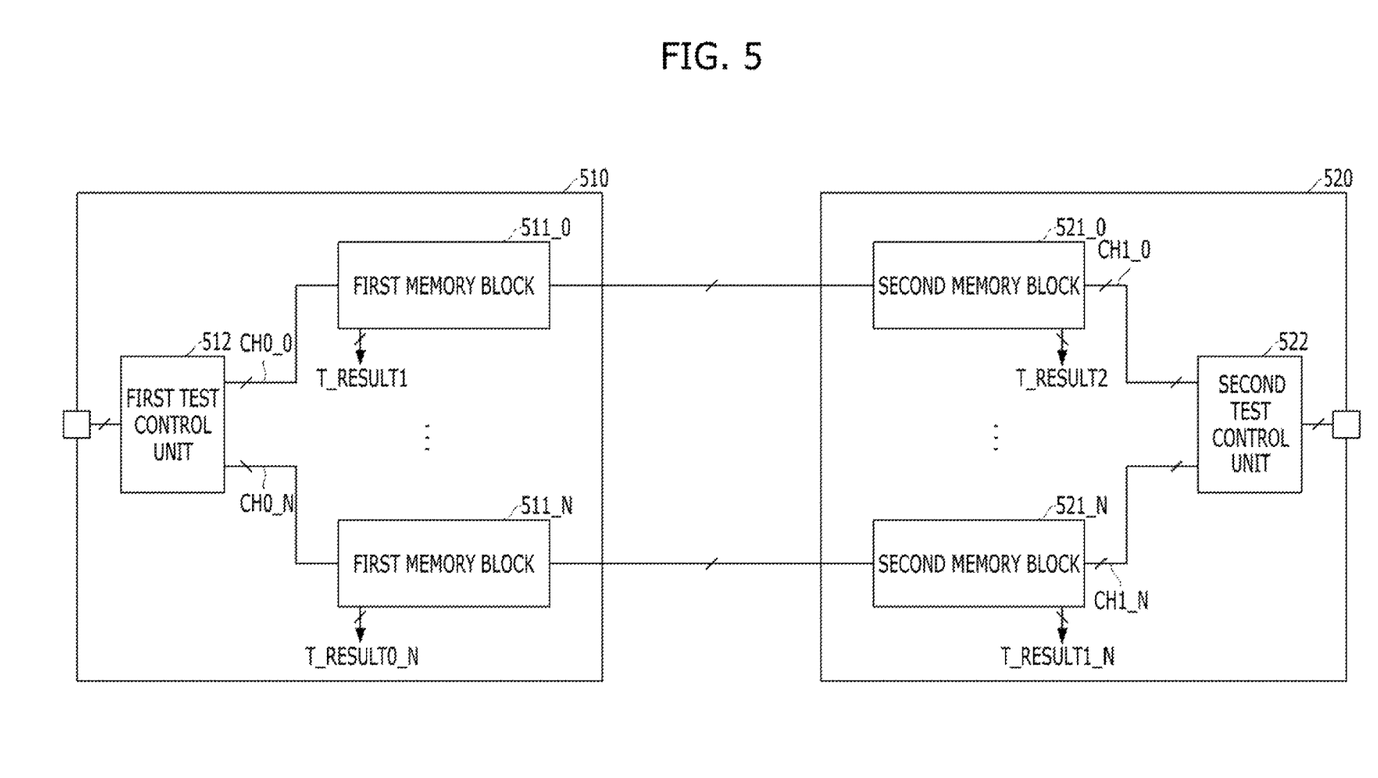
FIG. 5 is a configuration diagram of a memory system in accordance with an embodiment.

FIG. 5 is a configuration diagram of a memory system in accordance with an embodiment.

As shown in FIG. 5, a memory system may include a first memory device 510 and a second memory device 520. The first memory device 510 may include a plurality of first memory blocks 511_0 to 511_N, a first test control unit 512, and a plurality of first channels CH0_0 to CH0_N. The second memory device 520 may include a plurality of second memory blocks 521_0 to 521_N, a second test control unit 522, and a plurality of second channels CH1_0 to CH1_N.

The memory system will be described below with reference to FIG. 5.

In the case of the memory device of FIG. 2, a test is performed by inputting and outputting data among the memory blocks included in the same memory device. However, in the case of the memory system of FIG. 5, a test may be performed by inputting and outputting data among the memory blocks included in different memory devices.

The first and second memory devices 510 and 520 may be the same as the memory device of FIG. 2. The plurality of first memory blocks 511_0 to 511_N and the plurality of second memory blocks 521_0 to 521_N correspond to each other, and, in a test, the first and second test control units 512 and 522 may control a first memory block and a second memory block corresponding to each other, in such a way that different operations are performed.

For example, in the test, if the first test control unit 512 controls the plurality of first memory blocks 511_0 to 511_N to perform a read operation, the second test control unit 522 may control the plurality of second memory blocks 521_0 to 521_N to perform a write operation. Conversely, in the test, if the first test control unit 512 controls the plurality of first memory blocks 511_0 to 511_N to perform the write operation, the second test control unit 522 may control the plurality of second memory blocks 521_0 to 521_N to perform the read operation.

In the test, in the case where the first test control unit 512 controls the odd-numbered first memory blocks 511_0, 511_2, . . . among the plurality of first memory blocks 511_0 to 511_N, to perform the read operation, and controls the even-numbered first memory blocks 511_1, 511_3, . . . among the plurality of first memory blocks 511_0 to 511_N, to perform the write operation, the second test control unit 522 controls the odd-numbered second memory blocks 521_0, 521_2, . . . among the plurality of second memory blocks 521_0 to 521_N, to perform the write operation, and controls the even-numbered second memory blocks 521_1, 521_3, . . . among the plurality of second memory blocks 521_0 to 521_N, to perform the read operation. The test may be performed in a variety of ways to control the corresponding first and second memory blocks in different operations.

The detailed configuration and operation of the memory blocks 511_0 to 511_N and 521_0 to 521_N are the same as described above with reference to FIGS. 2 to 4. If the test is completed, results T_RESULT0_0 to T_RESULT0_N and T_RESULT1_0 to T_RESULT1_N of comparing data are outputted from the respective memory blocks 511_0 to 511_N and 521_0 to 521_N of the first memory device 510 and the second memory device 520, and it is possible to determine whether the respective data transmission and reception units (corresponding to the data transmission and reception units 211_0 to 211_3 of the memory device of FIG. 2) of the memory blocks 511_0 to 511_N and 521_0 to 521_N operate properly.

As a consequence, in a memory system, even in the case where each of memory devices includes a plurality of memory blocks, all the memory blocks may be tested by using a minimum number of channels. Therefore, test time and cost may be decreased.

Figure 6:
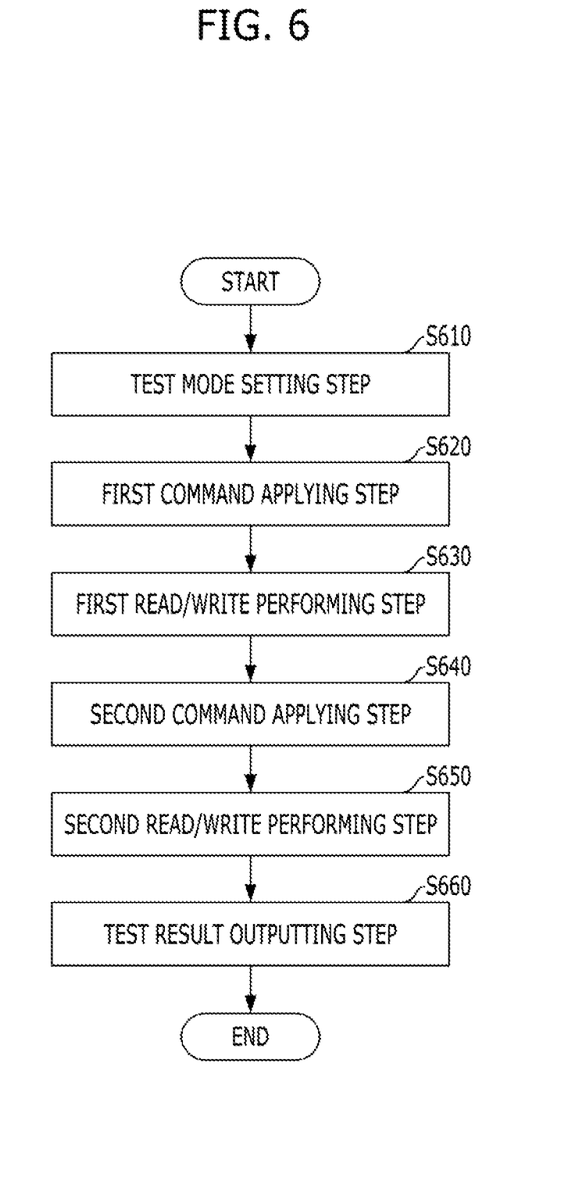
FIG. 6 is a flow chart explaining a method for operating a memory device in accordance with an embodiment.

FIG. 6 is a flow chart explaining a method for operating a memory device in accordance with an embodiment. The method for operating a memory device, shown in FIG. 6, may be used in a memory device which includes two or more memory blocks.

The method for operating a memory device will be described with reference to FIGS. 2 and 6.

The memory device may include the first and second memory blocks 210_0 and 210_1, and the channels CH_0 and CH_1 for transmitting the plurality of command signals CMDs to the respective memory blocks 210_0 and 210_1. The data transmission and reception unit 211_0 of the first memory block 210_0 and the data transmission and reception unit 211_1 of the second memory block 210_1 may be connected with each other.

For a test, the first and second memory blocks 210_0 and 210_1 may be set to a test mode (S610). After the test mode is set, the plurality of command signals CMDs may be applied to the first memory block 210_0 and the second memory block 210_1, and the first command signal WEB among the plurality of command signals CMDs, which distinguishes write and read operations, may be applied at different values (S620).

The first command signal WEB which is applied to the first memory block 210_0 may be deactivated, and the first command signal WEB which is applied to the second memory block 210_1 may be activated. Accordingly, the first memory block 210_0 performs the read operation, and the second memory block performs the write operation (S630). The data read from the first memory block 210_0 may be inputted to the second memory block 210_1, and the second memory block 210_1 may compare the inputted data and the test data stored therein and store a comparison result.

Next, while the plurality of command signals CMDs are applied to the first and second memory blocks 210_0 and 210_1, the first command signal WEB which is applied to the first memory block 210_0 may be activated, and the first command signal WEB which is applied to the second memory block 210_1 may be deactivated (S640). Accordingly, the first memory block 210_0 performs the write operation, and the second memory block performs the read operation (S650). The data read from the second memory block 210_1 may be inputted to the first memory block 210_0, and the first memory block 210_0 may compare the inputted data and the test data stored therein and store a comparison result.

A memory block of the first and second memory blocks 210_0 and 210_1, which performs the read operation, may output the test data in synchronization with the first strobe signal RDQS, and the other memory block of the first and second memory blocks 210_0 and 210_1, which performs the write operation, may receive the test data in synchronization with the second strobe signal WDQS which is generated by delaying the first strobe signal RDQS by a predetermined delay value.

If the test is completed, the first and second memory blocks 210_0 and 210_1 may output results T_RESULT1 and T_RESULT2 of comparing the inputted data and the test data stored in them (S660).

The method for operating a memory device may simultaneously test all memory blocks even in the case where a plurality of memory blocks are included. Accordingly, test time and cost may be decreased.

While only one of each of a pad, a receiver, a transmitter and a signal line, through which a plurality of signals are inputted and outputted, is illustrated for the simple illustration, it is to be noted that a plurality of pads, receivers, transmitters and signal lines may be included.

As is apparent from the above descriptions, according to the embodiments, since signals necessary for a test are applied in common to a plurality of memory blocks which receive and output signals through respective channels, it is possible to reduce the number of ports needed to test a memory device.

Also, according to the embodiments, while test signals are applied in common to the plurality of memory blocks, a part of the test signals, i.e., a command signal, has different values in the respective memory blocks. The plurality of memory blocks simultaneously perform a variety of test signal input operations and signal output operations.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
a first memory block configured to transmit and receive signals through a first channel;
a second memory block configured to transmit and receive signals through a second channel; and
a test control unit configured to transfer a row address strobe signal, a column address strobe signal, a chip select signal and a plurality of address signals which are the same as the row address strobe signal, the column address strobe signal, the chip select signal and the plurality of address signals inputted from an exterior, to the first and second channels, but applying a write enable signal to the first and second channels at different values in in a test operation, wherein the write enable signal distinguishes write and read operations of the first and second memory blocks,
wherein, when the first memory block performs a read operation in the test operation, the second memory block performs a write operation, and data outputted from the first memory block is inputted to the second memory block,
wherein each of the first memory block and the second memory block comprises:
a cell array including a plurality of memory cells;
a data reception unit configured to receive data from an exterior of the memory block;
a data transmission unit configured to output data of the cell array in operations other than the test operation, and output test data in the test operation; and
an internal test control unit configured to output the test data through the data transmission unit during the read operation, and store a result of comparing data inputted through the data reception unit and the test data during the write operation, in the test operation,
wherein the first memory block generates a first strobe signal and outputs the test data in synchronization with the first strobe signal,
wherein the second memory block generates a second strobe signal by delaying the first strobe signal by a predetermined delay value and receives the test data in synchronization with the second strobe signal.

2. The memory device according to claim 1,
wherein the first strobe signal is activated after a first latency passes from a time when the plurality of command signals corresponding to the read operation is applied,
wherein the second strobe signal is activated after a second latency passes from a time when the plurality of command signals corresponding to the write operation is applied, and
wherein the first latency and the second latency are set to be the same value.

3. The memory device according to claim 1, further comprising:
a third memory block configured to transmit and receive signals through a third channel; and
a fourth memory block configured to transmit and receive signals through a fourth channel,
wherein the test control unit transfers the row address strobe signal, the column address strobe signal, the chip select signal and a plurality of address signals which are the same as the row address strobe signal, the column address strobe signal, the chip select signal and the plurality of command signals inputted from the exterior, to the third and fourth channels, and applies the write enable signal to the third and fourth channels at different values in the test operation, wherein the write enable signal distinguishes write and read operations of the first and second memory blocks,
wherein, when the third memory block performs a read operation in the test operation, the fourth memory block performs a write operation, and data outputted from the third memory block is inputted to the fourth memory block.

4. The memory device according to claim 1,
wherein the first memory block performs a write operation after the read operation and the second memory block performs a read operation after the write operation, and
wherein, when the first memory block and the second memory block perform both the read and write operations, values stored in the internal test control units of the first memory block and the second memory block are outputted to the exterior.

5. A memory system comprising:
a first memory device including a plurality of first memory blocks which transmit and receive signals through a plurality of first channels, respectively, and a first test control unit which applies a plurality of command signals from an exterior of the first memory device to the plurality of first channels, in a test operation; and
a second memory device including a plurality of second memory blocks which transmit and receive signals through a plurality of second channels, respectively, and correspond to the plurality of first memory blocks, respectively, and a second test control unit which applies the plurality of command signals from an exterior of the second memory device to the plurality of second channels, in the test operation, wherein the first test control unit and the second test control unit transfers a row address strobe signal, a column address strobe signal, a chip select signal and a plurality of address signals which are the same as a row address strobe signal, a column address strobe signal, a chip select signal and a plurality of command signals inputted from an exterior, to the first channels and the second channels, but applying a write enable signal to the first channels and the channels at different values in in a test operation, wherein the write enable signal distinguishes write and read operations of the first and second memory blocks, wherein, when the first memory blocks perform a read operation in the test operation, the second memory blocks perform a write operation, and data outputted from the first memory blocks is inputted to the second memory blocks corresponding thereto, respectively, wherein each of the first memory blocks and the second memory blocks comprises:
 a cell array including a plurality of memory cells;
 a data reception unit suitable for receiving data from an exterior of the memory block;
 a data transmission unit suitable for outputting data of the cell array in operations other than the test operation, and outputting output test data in the test operation; and
 an internal test control unit suitable for outputting the test data through the data transmission unit during the read operation, and storing a result of comparing data inputted through the data reception unit and the test data during the write operation, in the test operation, wherein the first memory blocks generate a first strobe signal and outputs the test data in synchronization with the first strobe signal, wherein the second memory blocks generate a second strobe signal by delaying the first strobe signal by a predetermined delay value and receive the test data in synchronization with the second strobe signal.

6. The memory system according to claim 5, wherein the first strobe signal is activated after a first latency passes from a time when the plurality of command signals corresponding to the read operation is applied, wherein the second strobe signal is activated after a second latency passes from a time when the plurality of command signals corresponding to the write operation is applied, and wherein the first latency and the second latency are set to the same value.

* * * * *